United States Patent
Okumura et al.

(10) Patent No.: US 8,173,509 B2
(45) Date of Patent: May 8, 2012

(54) SEMICONDUCTOR DEVICE AND METHOD FOR MANUFACTURING THE SAME

(75) Inventors: Hideki Okumura, Ibo-gun (JP); Takayoshi Nogami, Himeji (JP); Hiroto Misawa, Ibo-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 12/714,586

(22) Filed: Mar. 1, 2010

(65) Prior Publication Data

US 2010/0151644 A1  Jun. 17, 2010

Related U.S. Application Data

(62) Division of application No. 12/164,389, filed on Jun. 30, 2008, now Pat. No. 7,700,998.

(30) Foreign Application Priority Data

Jul. 3, 2007 (JP) .................................. 2007-174979

(51) Int. Cl.
H01L 29/80 (2006.01)
H01L 31/112 (2006.01)

(52) U.S. Cl. ........ 438/270; 438/259; 438/430; 257/327; 257/330

(58) Field of Classification Search .................. 438/270, 438/259; 257/327, 330, E29.027, E21.41
See application file for complete search history.

(56) References Cited

U.S. PATENT DOCUMENTS

| | | | |
|---|---|---|---|
| 4,871,685 A * | 10/1989 | Taka et al. ..................... | 438/361 |
| 5,378,911 A * | 1/1995 | Murakami .................... | 257/334 |
| 6,359,306 B1 | 3/2002 | Ninomiya | |
| 6,627,499 B2 | 9/2003 | Osawa | |
| 2002/0130359 A1 | 9/2002 | Okumura et al. | |
| 2005/0253190 A1 | 11/2005 | Okumura et al. | |
| 2006/0054970 A1 | 3/2006 | Yanagida et al. | |
| 2006/0226475 A1 | 10/2006 | Yamamoto et al. | |
| 2007/0267672 A1 | 11/2007 | Hokomoto et al. | |
| 2008/0296678 A1 * | 12/2008 | Kim .............................. | 257/341 |

FOREIGN PATENT DOCUMENTS

JP  2006-59940  3/2006
JP  2006-294853  10/2006

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

A type semiconductor device includes: a first semiconductor layer of a first conductivity type; a second semiconductor layer of a second conductivity type; a third semiconductor layer of the first conductivity type; a plurality of gate electrodes which are formed in gate trenches via gate insulating films, the gate trenches being formed through the second semiconductor layer and the third semiconductor layer; a plurality of impurity regions of the second conductivity type which are formed at regions below bottoms of contact trenches, the contact trenches being formed at the third semiconductor layer in a thickness direction thereof between corresponding ones of the gate trenches and longitudinal cross sections of the contact trenches being shaped in ellipse, respectively; first electrodes which are formed so as to embed the contact trenches and contacted with the impurity regions, respectively; and a second electrode formed on a rear surface of the semiconductor substrate.

11 Claims, 3 Drawing Sheets

ND METHOD
SEMICONDUCTOR DEVICE AND METHOD FOR MANUFACTURING THE SAME

CROSS-REFERENCE TO RELATED APPLICATIONS

This application is a division of and claims the benefit of priority under 35 U.S.C. §120 from U.S. Ser. No. 12/164,389 filed Jun. 30, 2008, and claims the benefit of priority under 35 U.S.C. §119 from Japanese Patent Application No. 2007-174979 filed Jul. 3, 2007, the entire contents of each of which are incorporated herein by reference.

BACKGROUND OF THE INVENTION

1. Field of the Invention

The present invention relates to a semiconductor device such as an field effect transistor, particularly a vertical field effect transistor (MOSFET) and a method for manufacturing the semiconductor device.

2. Description of the Related Art

A MOS transistor such as a power MOSFET (Metal Oxide Semiconductor Field Effect Transistor) and an IGBT (Insulated Gate Bipolar Transistor) can be exemplified as a semiconductor device for electric power control. In view of energy saving, recently, it is required the efficiency of the semiconductor device is enhanced. With the semiconductor device for electric power control, the electric conduction loss, that is, the on-resistance of the device is reduced in order to enhance the efficiency of the semiconductor device. As of now, the reduction of on-resistance would be conducted by miniaturizing the cells of the semiconductor device.

Alternatively, a trench gate structure is applied to the semiconductor device so that the size of each cell can be remarkably miniaturized while the channel widths in the semiconductor device can be maintained. At present, the cells of the semiconductor device are much more miniaturized by using the trench gate structure so that the on-resistance of the semiconductor device can be remarkably improved. Moreover, second trenches are formed at the respective source regions so as to form the source contacts with the side walls of the second trenches. Such a structure is called as a "trench contact structure".

Referring to Reference 1, for example, a plurality of contact trenches are arranged in the direction along the gate trenches so as to increase the contact areas between the respective source electrodes and source regions and thus, to reduce the on-resistance of the semiconductor device. Each contact trench is configured such that a through hole is formed at the area to be formed as a source region between the adjacent gate trenches and the side wall of the through hole is entirely rendered the source region.

In Reference 1, however, since each cell is miniaturized, the embedding condition of electrode material for forming the source electrode into the contact trench per cell is deteriorated so that some voids may be formed in the resultant source electrode. As a result, the contact resistances in the respective contact trenches may be increased so that the on-resistance of the semiconductor device may be also increased. In Reference 2, in this point of view, each contact trench is shaped linearly so as to improve the embedding condition of the electrode material therein and thus, improve the on-resistance of the semiconductor device through the reduction in contact resistance of each contact trench.

[Reference 1] JP-A 2006-59940 (KOKAI)
[Reference 2] JP-A 2006-294853 (KOKAI)

In Reference 2, however, impurity regions are formed so as to embed the corresponding contact trenches so that the contacts between the source electrodes and the impurity regions are formed at the upper sides of the corresponding contact trenches. As a result, the Vsus (Vsustain) tolerance of the semiconductor device such as a transistor as described above may be weakened.

In References 1 and 2, however, since each contact trench is formed by means of anisotropic etching such as RIE (reactive ion etching), impurities are implanted into the side wall of each contact trench when the impurity region is formed so that the contact resistance per cell, that is, the on-resistance of the semiconductor device is increased.

BRIEF SUMMARY OF THE INVENTION

An aspect of the present invention relates to a trench gate type semiconductor device with trench contact structure, including: a first semiconductor layer of a first conductivity type formed above a main surface of a semiconductor substrate; a second semiconductor layer of a second conductivity type formed on the first semiconductor layer; a third semiconductor layer of the first conductivity type formed on the second semiconductor layer; a plurality of gate electrodes which are formed in corresponding gate trenches via corresponding gate insulating films, the gate trenches being formed through the second semiconductor layer and the third semiconductor layer so as to run into the first semiconductor layer; a plurality of impurity regions of the second conductivity type which are formed at regions below bottoms of corresponding contact trenches, the contact trenches being formed at the third semiconductor layer in a thickness direction thereof between corresponding ones of the gate trenches and longitudinal cross sections of the contact trenches being shaped in ellipse, respectively; first electrodes which are formed so as to embed the contact trenches and contacted with the impurity regions, respectively; and a second electrode formed on a rear surface of the semiconductor substrate.

Another aspect of the present invention relates to a method for manufacturing a trench gate type semiconductor device with trench contact structure, including: forming a first: semiconductor layer of a first conductivity type above a main surface of a semiconductor substrate; forming a second semiconductor layer of a second conductivity type on the first semiconductor layer; forming a third semiconductor layer of the first conductivity type on the second semiconductor layer; conducting etching treatment for the first semiconductor layer, the second semiconductor layer and the third semiconductor layer via a first mask to form a plurality of gate electrodes so as to run into the first semiconductor layer through the second semiconductor layer and the third semiconductor layer; forming gate electrodes in the gate trenches via gate insulating films, respectively; conducting isotropic etching for the third semiconductor layer via a second mask to form contact trenches with respective longitudinal elliptical cross sections at the third semiconductor layer in a thickness direction thereof between corresponding ones of the gate trenches; conducting ion implantation of impurity of the second conductivity type for bottoms of the contact trenches to form a plurality of impurity regions of the second conductivity type at regions below the bottoms of the contact trenches; forming first electrodes so as to embed the contact trenches and contacted with the impurity regions, respectively; and forming a second electrode on a rear surface of the semiconductor substrate.

DETAILED DESCRIPTION OF THE PREFERRED EMBODIMENTS

Then, some embodiments will be described with reference to the drawings.

(Semiconductor Device)

Figure 1:
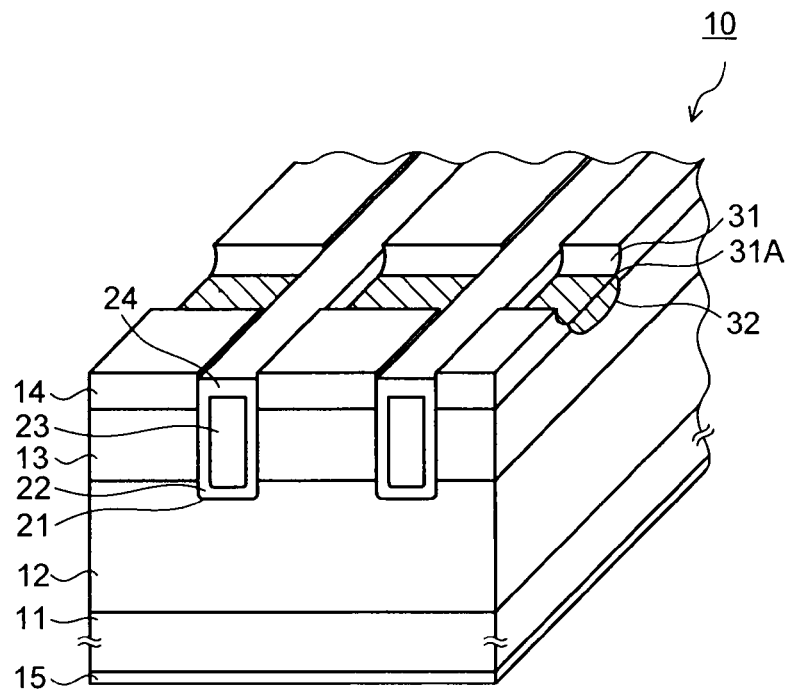
FIG. 1 is a perspective view schematically showing the structure of a semiconductor device according to an embodiment.

FIG. 1 is a perspective view schematically showing the structure of a MOS transistor as a semiconductor device according to an embodiment. In order to clarify the feature of the embodiment, the details of the constituent components may be illustrated different from the practical constituent components.

In the semiconductor device 10 in FIG. 1, an $n^-$-type epitaxial silicon semiconductor layer 12 as a first semiconductor layer, a p-type silicon semiconductor layer 13 as a second semiconductor layer, and an $n^+$-type silicon semiconductor layer 14 as a third semiconductor layer are subsequently formed on the main surface of an $n^+$-type silicon substrate 11. Then, a plurality of gate trenches 21 are formed through the p-type silicon semiconductor layer 13 and the $n^+$-type silicon semiconductor layer 14 in the stacking direction thereof so as to run into the $n^-$-type epitaxial silicon semiconductor layer 12 and to be arranged parallel to one another.

With an IGBT which is the one of MOS transistors, the $n^-$-type epitaxial silicon semiconductor layer 12 as the first semiconductor layer is formed on a $p^+$-type silicon substrate instead of the $n^+$-type silicon substrate 11 via an $n^+$-type silicon semiconductor layer. The conductivity type of each layer may be converted into the opposite conductivity type throughout the embodiments as described above and as will be described below.

Then, gate electrodes 23 are formed in the respective gate trenches 21 via respective gate insulating films 22. Then, embedding interlayer insulating films 24 are formed on the respective gate electrodes 23. Then, a plurality of contact trenches 31 are formed at the $n^+$-type silicon semiconductor layer 14 in the thickness direction thereof. The longitudinal cross section of each gate trench 21 is shaped in semiellipse.

Then, $p^+$-impurity regions 32 are formed in the bottoms of the respective contact trenches 31, and first electrodes (not shown) are formed at the respective contact trenches 31. In this case, since the $p^+$-impurity regions 32 are formed at the respective contact trenches 31, the contact resistances of the respective first electrodes against the respective contact trenches 31 can be decreased. Then, a second electrode 15 is formed at the rear surface of the $N^+$-type silicon substrate 11.

In this embodiment, the $n^-$-type epitaxial silicon semiconductor layer 12 functions as a drain layer, and the p-type silicon semiconductor layer 13 functions as a base layer, and the $n^+$-type silicon semiconductor layer 14 functions as a source layer. Then, the first electrodes function as source electrodes, respectively, and the second electrode 15 functions as a drain electrode. As a result, the semiconductor device in this embodiment functions as a vertical field effect transistor (MOSFET).

In this embodiment, the source electrodes as the first electrodes (not shown) are formed so as to embed the respective elliptical contact trenches 31. Therefore, since the mobility of carriers generated at the state of gate-off is remarkably increased, the deterioration of the Vsus tolerance of the semiconductor device (MOS transistor) 10 can be prevented.

Moreover, according to the manufacturing method as will described below, since the impurity implantation is conducted only at the bottoms 31A of the contact trenches 31 and not at the side walls of the contact trenches 31, the impurities are not implanted into the side surfaces of the $n^+$-type silicon semiconductor layer 14 exposed to the contact trenches 31 so that the concentration of the n-type impurity of the $n^+$-type silicon semiconductor layer 14 at the side surfaces thereof can not be substantially decreased. Furthermore, since the source electrodes (first electrodes) are formed so as to embed the respective contact trenches 31, the contact areas between the respective source electrodes and the respective contact trenches 31 can be increased so that the contact resistances between the source electrodes and the contact trenches 31 can be decreased and thus, the on-resistance of the MOS transistor (semiconductor device) 10 can be decreased.

In addition, since the contact trenches 31 are formed only at the $n^+$-type silicon semiconductor layer 14, the aspect ratio of each contact trench 31 can be maintained small even though each cell in the MOS transistor (semiconductor device) 10 is miniaturized. Therefore, the source electrodes (first electrodes) can be formed in the respective contact trenches 31 with no voids by means of a simple technique.

Moreover, although the contact trenches 31 are formed by means of isotropic etching after the gate trenches 21 through the interlayer insulating films 24 are formed, the lateral etching can be prevented by the respective interlayer insulating films 24 during the isotropic etching because the contact trenches 31 are formed at the $n^+$-type silicon semiconductor layer 14 and thus, the top surfaces of the interlayer insulating films 24 are positioned above the bottoms 31A of the contact trenches 31, respectively, so as to close the sides of the contact trenches 31 by the interlayer insulating films 24. Therefore, the contact trenches 31 can be easily formed. In addition, the patterning process for the $n^+$-type silicon semiconductor layer 14 (source layer) can be omitted by the etching prevention effect of the interlayer insulating films 24.

(Method for Manufacturing a Semiconductor Device)

Then, the manufacturing method of the semiconductor device will be described. In this embodiment, the characteristic steps in the manufacturing method will be described.

Figure 2:
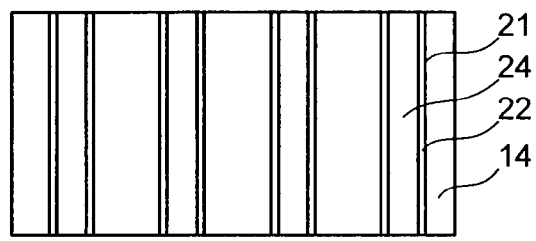
FIG. 2 is an explanatory view schematically showing a method for manufacturing a semiconductor device according to an embodiment.
Figure 3:
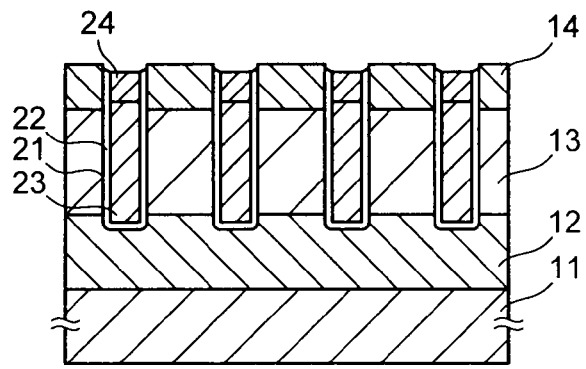
FIG. 3 is also an explanatory view schematically showing a method for manufacturing a semiconductor device according to the embodiment.
Figure 4:
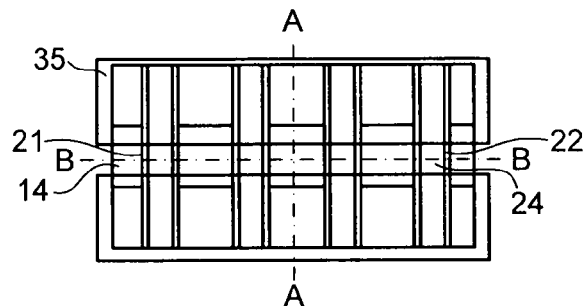
FIG. 4 is also an explanatory view schematically showing a method for manufacturing a semiconductor device according to the embodiment.
Figure 5:
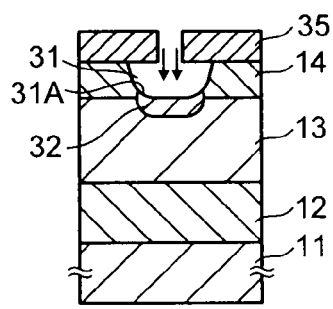
FIG. 5 is also an explanatory view schematically showing a method for manufacturing a semiconductor device according to the embodiment.
Figure 6:
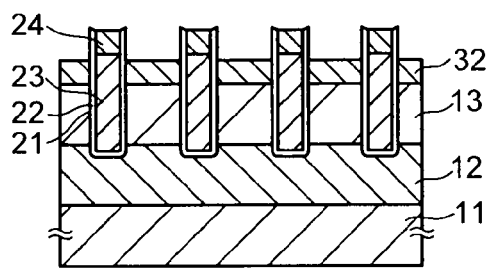
FIG. 6 is also an explanatory view schematically showing a method for manufacturing a semiconductor device according to the embodiment.
Figure 7:
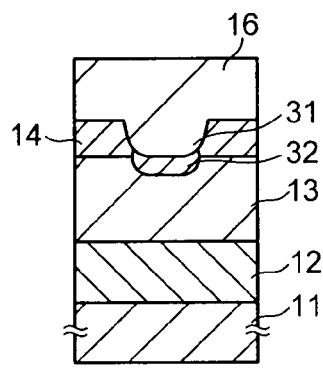
FIG. 7 is also an explanatory view schematically showing a method for manufacturing a semiconductor device according to the embodiment.
Figure 8:
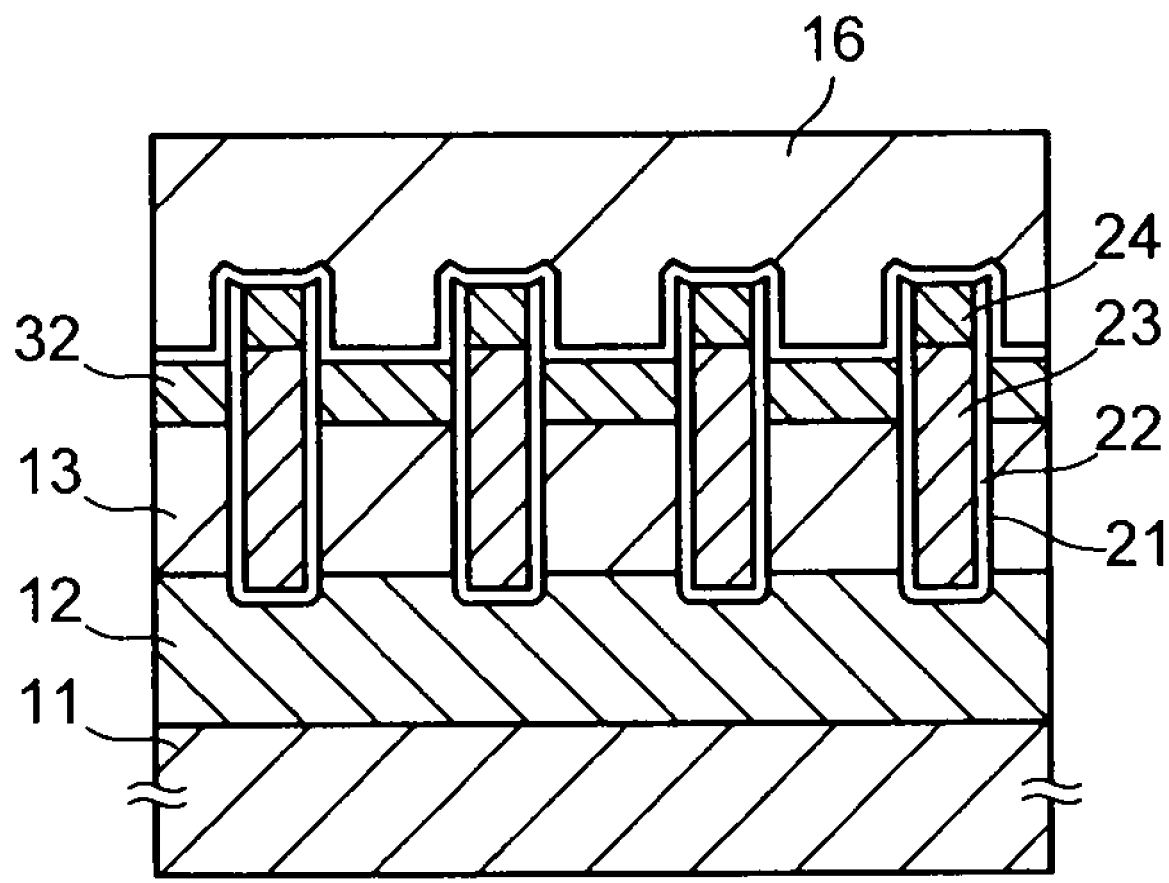
FIG. 8 is an explanatory view schematically showing a method for manufacturing a semiconductor device according to the embodiment.

FIGS. 2 to 7 are explanatory views schematically showing the manufacturing method in this embodiment. FIG. 2 is a top plan view showing an assembly under manufacture, and FIG. 3 is a cross sectional view of the assembly shown in FIG. 2. FIG. 4 is also a top plan view showing an assembly under manufacture, and FIG. 5 is a cross sectional view of the assembly shown in FIG. 4, taken on line A-A, and FIG. 6 is a cross sectional view of the assembly shown in FIG. 4, taken on line B-B. FIGS. 7 and 8 are cross sectional views showing an assembly after the step shown in FIGS. 4 to 6. The assembly state in FIG. 7 corresponds to the assembly state in FIG. 4 and the assembly state in FIG. 8 corresponds to the assembly state in FIG. 5.

As shown in FIGS. 2 and 3, first of all, the n-type epitaxial silicon semiconductor layer 12 with an impurity concentration of $1\times10^{16}/cm^3$ is grown in a thickness of about. 5 μm on the main surface of the $n^+$-type silicon substrate 11 with an impurity concentration of $1\times10^{20}/cm^3$, for example. Then, the p-type silicon semiconductor layer 13 with a p-type impurity (e.g., boron (B)) concentration of $1\times10^{13}/cm^3$ to $1\times10^{14}/cm^3$ is formed in a thickness of about 1 μm on the $n^-$-type epitaxial silicon semiconductor layer 12. Then, the $n^+$-type silicon semiconductor layer 14 with an n-type impurity (e.g., arsenic (As)) concentration of about $1\times10^{20}/cm^3$ is formed in a thickness of about 0.4 μm on the p-type silicon semiconductor layer 13.

With the IGBT, the $n^-$-type epitaxial silicon semiconductor layer 12 is formed above the $p^+$-type silicon substrate.

Then, a first resist mask with a predetermined pattern is formed on the thus obtained multilayered structure (assembly), and the anisotropic etching such as RIE is conducted for the multilayered structure (assembly) via the first resist mask so that the plurality of gate trenches 21 are formed through the p-type silicon semiconductor layer 13 and the $n^+$-type silicon semiconductor layer 14 in the stacking direction thereof so as to run into the $n^-$-type epitaxial silicon semiconductor layer 12. After the first resist mask is removed, thermal oxidation treatment is conducted for the gate trenches 21 so as to form the gate insulating films 22 on the side walls of the respective gate trenches 21. Then, the gate electrodes 23 are formed of polysilicon with n-type impurity at high concentration so as to embed the respective gate trenches 21, and then, the interlayer insulating films 24 are formed.

Then, as shown in FIGS. 4 to 6, a second resist mask 35 is formed on the assembly manufactured according to the steps as described above. The second resist mask 35 has a pattern of which the openings are orthogonal to the long direction of the gate trenches 21. Then, isotropic etching such as CDE (chemical dry etching) is conducted for the $n^+$-type silicon semiconductor layer 14 via the second resist mask 35 so that the contact trenches 31 with longitudinal semielliptical cross section are formed at the $n^+$-type silicon semiconductor layer 14 in the thickness direction.

In this case, the lateral etching can be prevented by the respective interlayer insulating films 24 during the isotropic etching because the interlayer insulating films 24 function as etching stoppers. In addition, the patterning process for the $n^+$-type silicon semiconductor layer 14 (source layer) can be omitted by the etching prevention effect of the interlayer insulating films 24.

Since the contact trenches 31 are formed by means of the isotropic etching such as CDE, each contact trench 31 is formed larger than the opening of the second resist mask 35 as shown in FIG. 5.

Another isotropic etching may be employed, but the contact trenches 31 with the elliptical cross sections can be easily formed by means of the CDE.

Then, ion implantation of, e.g., boron ($BF_2$) is conducted for the contact trenches 31 via the second resist mask 35. In this case, since the edges of the second resist mask 35 exposing to the openings thereof are protruded inside the contact trenches 31 from the edges thereof so that the second resist mask 35 is shaped in pent roof, the ion implantation can be conducted for the bottoms 31A of the contact trenches 31 and not for the side surfaces of the $n^+$-type silicon semiconductor layer 14 exposing to the contact trenches 31. Therefore, the concentration of the n-type impurity of the $n^+$-type silicon semiconductor layer 14 at the side surfaces thereof can not be substantially decreased and the $p^+$ impurity regions 32 can be formed at the bottoms of the respective contact trenches 31 over the $n^+$-type silicon semiconductor layer 14 and the p-type silicon semiconductor layer 13.

Then, after the second resist mask 35 is removed, electrode material is deposited so as to embed the contact trenches 31 of the assembly under manufacture so as to form the first electrodes 16 as the source electrodes in the respective contact trenches 31, as shown in FIGS. 7 and 8. Then, the second electrode 15 is formed as the drain electrode on the rear surface of the $n^+$-type silicon substrate 11, thereby constituting the longitudinal field effect transistor as shown in FIG. 1.

In this embodiment, as described above, since the first electrodes (source electrodes) 16 are formed so as to embed the semielliptical contact trenches 31, the mobility of carriers generated at the state of gate-off is remarkably increased so that the deterioration of the Vsus tolerance of the semiconductor device (MOS transistor) 10 can be prevented.

Moreover, since the impurity implantation is conducted for the contact trenches 31 via the pent roof-shaped second resist mask 35, the impurity implantation can be conducted only at the bottoms 31A of the contact trenches 31 and not at the side walls of the contact trenches 31. As a result, the impurities are not implanted into the side surfaces of the $n^+$-type silicon semiconductor layer 14 exposed to the contact trenches 31 so that the concentration of the n-type impurity of the $n^+$-type silicon semiconductor layer 14 at the side surfaces thereof can not be substantially decreased. Furthermore, since the source electrodes (first electrodes) 16 are formed so as to embed the respective contact trenches 31, the contact areas between the respective source electrodes 16 and the respective contact trenches 31 can be increased so that the contact resistances between the source electrodes 16 and the contact trenches 31 can be decreased and thus, the on-resistance of the MOS transistor (semiconductor device) 10 can be decreased.

In addition, since the contact trenches 31 are formed only at the $n^+$-type silicon semiconductor layer 14, the aspect ratio of each contact trench 31 can be maintained small even though each cell in the MOS transistor (semiconductor device) 10 is miniaturized. Therefore, the source electrodes (first electrodes) can be formed in the respective contact trenches 31 with no voids by means of a simple technique.

Moreover, although the contact trenches 31 are formed by means of isotropic etching, the lateral etching can be prevented by the respective interlayer insulating films 24 during the isotropic etching because the contact trenches 31 are formed at the $n^+$-type silicon semiconductor layer 14. Therefore, the contact trenches 31 can be easily formed. In addition, the patterning process for the $n^+$-type silicon semiconductor layer 14 (source layer) can be omitted by the etching prevention effect of the interlayer insulating films 24.

Although the present invention was described in detail with reference to the above examples, this invention is not limited to the above disclosure and every kind of variation and modification may be made without departing from the scope of the present invention.

The invention claimed is:

1. A method for manufacturing a trench gate type semiconductor device with trench contact structure, comprising:
    forming a first semiconductor layer of a first conductivity type above a main surface of a semiconductor substrate;
    forming a second semiconductor layer of a second conductivity type on said first semiconductor layer;
    forming a third semiconductor layer of said first conductivity type on said second semiconductor layer;
    conducting etching treatment for said first semiconductor layer, said second semiconductor layer and said third semiconductor layer via a first mask to form a plurality of gate trenches so as to run into said first semiconductor layer through said second semiconductor layer and said third semiconductor layer;
    forming gate electrodes in said gate trenches via gate insulating films, respectively;
    conducting isotropic etching for said third semiconductor layer via a second mask to form contact trenches with respective longitudinal semielliptical cross sections at said third semiconductor layer in a thickness direction thereof between corresponding ones of said gate trenches;
    conducting ion implantation of impurity of said second conductivity type for bottoms of said contact trenches to form a plurality of impurity regions of said second conductivity type at regions below said bottoms of said contact trenches;
    forming first electrodes so as to embed said contact trenches and contacted with said impurity regions, respectively; and
    forming a second electrode on a rear surface of said semiconductor substrate.

2. The manufacturing method as set forth in claim 1, wherein said ion implantation is conducted via said second mask.

3. The manufacturing method as set forth in claim 2, wherein said second mask is patterned so that openings of said second mask are orthogonal to said gate trenches, respectively.

4. The manufacturing method as set forth in claim 2, wherein said second mask is shaped in pent roof so that edges of said second mask exposing to openings thereof are protruded inside said contact trenches from edges thereof.

5. The manufacturing method as set forth in claim 2, wherein each of said contact trenches is formed larger than a corresponding one of said openings of said second mask.

6. The manufacturing method as set forth in claim 1, wherein said isotropic etching is chemical dry etching (CDE).

7. The manufacturing method as set forth in claim 1, wherein said etching treatment is anisotropic etching treatment.

8. The manufacturing method as set forth in claim 1, wherein said impurity regions are formed so as to run into said second semiconductor layer from said third semiconductor layer.

9. The manufacturing method as set forth in claim 1, further comprising forming a plurality of interlayer insulating films on said gate electrodes, respectively after said gate electrodes are formed and before said contact trenches are formed.

10. The manufacturing method as set forth in claim 9, wherein said interlayer insulating films function as etching stoppers, respectively for said isotropic etching by forming said interlayer insulating films so that top surfaces of said interlayer insulating films are positioned above said bottoms of said contact trenches, respectively.

11. The manufacturing method as set forth in claim 1, wherein said first semiconductor layer functions as a drain layer, said second semiconductor layer functions as a base layer, said third semiconductor layer functions as a source layer, said first electrodes function as respective source electrodes and said second electrode functions as a drain electrode, so that said semiconductor device functions as a vertical field effect transistor.

* * * * *